United States Patent
Schmidt

(12) 
(10) Patent No.: US 6,735,858 B1
(45) Date of Patent: May 18, 2004

(54) MANUFACTURING METHOD FOR AN ELECTRONIC APPARATUS AND ELECTRONIC APPARATUS WITH PLASTIC HOUSING

(75) Inventor: Harald Schmidt, Regensburg (DE)

(73) Assignee: Siemens Aktiengesellschaft (DE)

( * ) Notice: Subject to any disclaimer, the term of this patent is extended or adjusted under 35 U.S.C. 154(b) by 0 days.

(21) Appl. No.: 09/526,488

(22) Filed: Mar. 15, 2000

(30) Foreign Application Priority Data

Mar. 18, 1999 (DE) ......................................... 199 12 256

(51) Int. Cl.[7] ................................................ H05K 3/30
(52) U.S. Cl. ........................... 29/841; 29/830; 29/848; 29/832; 29/855; 264/272.11; 264/510
(58) Field of Search ...................... 29/830, 841, 848, 29/832, 855, 729; 264/272.11, 272.17, 510, 512, 544, 545

(56) References Cited

U.S. PATENT DOCUMENTS

| | | | |
|---|---|---|---|
| 3,424,623 A | | 1/1969 | Oakley et al. ............... 136/176 |
| 3,655,849 A | | 4/1972 | Hayashi ....................... 264/98 |
| 4,673,363 A | * | 6/1987 | Hudson et al. ................ 441/1 |
| 5,356,511 A | * | 10/1994 | Hoessel et al. .............. 438/780 |
| 5,523,045 A | * | 6/1996 | Kudert et al. ................ 264/255 |
| 5,705,104 A | * | 1/1998 | Trublowski et al. ........ 264/1.25 |
| 5,754,398 A | * | 5/1998 | Glovatsky et al. ........... 361/690 |
| 5,783,008 A | * | 7/1998 | Belke, Jr. et al. ........... 156/73.2 |
| 5,914,534 A | * | 6/1999 | Todd et al. .................. 257/686 |
| 5,967,804 A | * | 10/1999 | Yoshizawa et al. ............ 439/91 |
| 6,090,327 A | * | 7/2000 | Churchwell .................. 264/259 |

FOREIGN PATENT DOCUMENTS

| | | | | |
|---|---|---|---|---|
| DE | 41 20 670 A1 | | 1/1992 | |
| DE | 44 20 879 A1 | | 12/1995 | |
| DE | 197 07 437 A1 | | 8/1998 | |
| GB | 2239709 A | * | 10/1991 | ............ G01K/1/14 |

* cited by examiner

Primary Examiner—Lee D. Wilson
Assistant Examiner—Alvin J Grant

(57) ABSTRACT

A method of manufacturing an electronic apparatus having a plastic housing. The method includes blow molding with a one-piece plastic housing around an electronic circuit board populated with components. The circuit board is fastened and held in-situ during the blow molding. Fastening locations are defined by contiguously sandwiched portions of the housing and the electronic circuit board.

12 Claims, 2 Drawing Sheets

MANUFACTURING METHOD FOR AN ELECTRONIC APPARATUS AND ELECTRONIC APPARATUS WITH PLASTIC HOUSING

CROSS REFERENCE TO RELATED APPLICATIONS

This application claims the benefit of priority based on German Application No. 19912256.3, filed on Mar. 18, 1999, which is incorporated by reference herein in its entirety

BACKGROUND OF INVENTION

The invention relates to a method of manufacturing an electronic apparatus and to an electronic apparatus with a plastic housing, especially an electronic control apparatus for automotive technology.

Electronic apparatuses or control apparatuses which have a plastic housing are usually manufactured by injection molding. In the case of injection molding at least two housing parts are produced. A circuit board is next placed and fastened in at least one of the housing parts. The housing parts are then assembled and bonded together. Therefore, in manufacturing the apparatus, a plurality of operations must be performed.

In the periodical "Kunststoffe," published by Carl Hanser Verlag, Munich, Vol. 80 (1990), no. 12, pp 1333–1345 and Vol. 81 (1991), no. 1, pp 27–35, there is disclosed the production of plastic hollow goods by blow molding. An advantage of blow molding is that hollow goods can be manufactured in a single piece, which avoids problems with sealing. Also, such a single piece has great stability and rigidity. Although tools for blow molding are relatively economical, it is difficult to manufacture hollow goods of more complicated geometry (e.g., undercutting) by blow molding.

German Patent No. 44 20 879 A1 discloses s a conventional method of manufacturing hollow bodies with an internal supporting frame. A housing enveloping the supporting frame is made by blow molding methods. After the housing is filled it has to be closed-up with a floor and a cover.

German Patent No. 41 20 670 A1 discloses a conventional method for manufacturing a three-dimensional circuit substrate by blow molding.

German Patent No. 197 07 437 A1 discloses a conventional method for the manufacture of a multi-part housing by draw molding two pieces of film, whereby two housing shells are formed, Which are then cemented or welded together.

SUMMARY OF THE INVENTION

It is an aim of the present invention to create a method for manufacturing an electronic apparatus and an electronic apparatus with a plastic housing, which permit an especially simple and economical manufacture.

According to the invention, the fixing and mounting of the circuit board is integrated into the process for manufacturing the plastic housing, so that the separate insertion of the circuit board into the housing is eliminated.

A circuit board can be provided with a one-piece housing in the form of a hollow body. The populated circuit board is surrounded during the extrusion process with a tube of plastic that is viscous when heated. In this process the circuit board is embedded into the material of the plastic housing at least partially at its edges.

The method and the electronic apparatus are suitable for control apparatus and sensors, especially in automotive engineering. For example, in connection with air bag controllers and air bag sensors, it is especially advantageous that the housing can be formed by blow molding such that the housing is in contact in the area of a mounting point both with the bottom and with the upper side of the circuit board. The result is an optimal transfer of impulses from the vehicle's body to an acceleration sensor arranged in the apparatus.

The present invention is achieved by providing a method of manufacturing an electronic apparatus. The method comprises providing an electronic circuit board; and blow molding a one-piece plastic housing around the electronic circuit board such that the electronic circuit board is secured by the plastic housing.

The present invention is also achieved by providing a method for transferring impulses from a vehicle body to an electronic sensor. The method comprises mounting the electronic sensor on an electronic circuit board; blow molding a one-piece plastic housing around the electronic circuit board and the sensor such that the electronic circuit board is secured to the plastic housing; and fixing the one-piece plastic housing to the vehicle body.

The present invention is further achieved by providing an electronic apparatus. The electronic apparatus comprises a one-piece plastic housing made by blow molding; an electronic circuit board secured in-situ during blow molding the plastic housing; and at-least one location wherein the plastic housing contiguously sandwiches the electronic circuit board.

BRIEF DESCRIPTION OF THE DRAWINGS

The accompanying drawings, which are incorporated herein and constitute part of this specification, illustrate presently preferred embodiments of the invention, and, together with the general description given above and the detailed description given below, serve to explain features of the invention.

DETAILED DESCRIPTION OF THE PREFERRED EMBODIMENT

Figure 1:
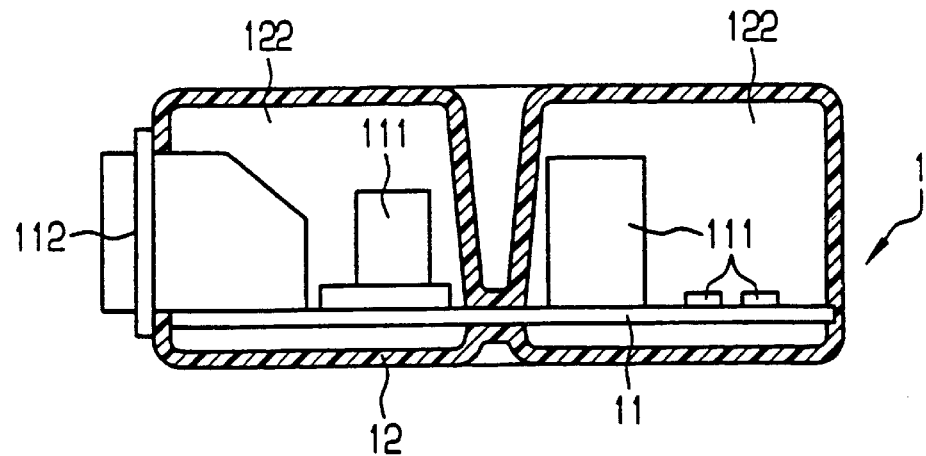
FIG. 1 is a section view through an electronic apparatus according to the present invention.

FIG. 1 shows an electronic apparatus 1 with a flat assembly comprising a circuit board 11, electronic components 111 arranged on the circuit board, and a terminal strip or plug connector 112 in contact with the circuit board. The electronic apparatus 1 is an air bag controller equipped with an acceleration sensor.

The circuit board 11 is surrounded by a plastic housing 12 produced by blow molding, and is clinched therein. The circuit board is clinched by the plastic housing 12 at the outer edges of the circuit board, at the plug connector and in a central section of the circuit board 11. When an especially great rigidity is to be achieved in the plastic housing, such clinching is done at several central sections between the circuit board 11 and the plastic housing. The plastic housing 12 forms an interior space 122, and more precisely two cavities in which the electronic components 111 are arranged.

When the electronic apparatus 1 is being made, first the circuit board 11 is completely populated, i.e., provided with the electronic components 111 and the terminal strip 112, and soldered. The circuit board is then positioned in the blow mold.

The blow mold consists of a head for feeding the melt, an opposite part in which the circuit board 11 or the plug connector 112 is held, and a head through which cooled air can be blown. The blow mold is closed between the heads for feeding the melt and the air by a bipartite body that surrounds them. This bipartite body determines the shape of the housing. When the housing is formed, a plastic tube is extruded from the head for feeding the melt and drawn downward with the use of gravity over the circuit board 11. The blow mold is closed and cool air is blown in from the opposite side in order to force the plastic tube against the contours of the blow mold and cool it. Also, the cool air prevents damage to the soldered terminals and electronic components. The air is blown in through a lance. The lance is introduced into the cavity formed by the blow mold through an opening in the plug connection 112 or in the blow mold.

Materials especially suitable for the blow molding of the plastic housing 12 are polyethylene (PE) and polypropylene (PP). If the rigidity of the plastic housing must satisfy more stringent requirements, materials with embedded reinforcing filaments can be employed. Likewise, the articles by W. Ast in the periodical, "Kunststoffe," Vol. 20 (1990), pp 1333–1345, and Vol. 81 (1991), no. 1, pp 27–35, may be consulted regarding suitable materials and blow molding techniques.

Figure 2:
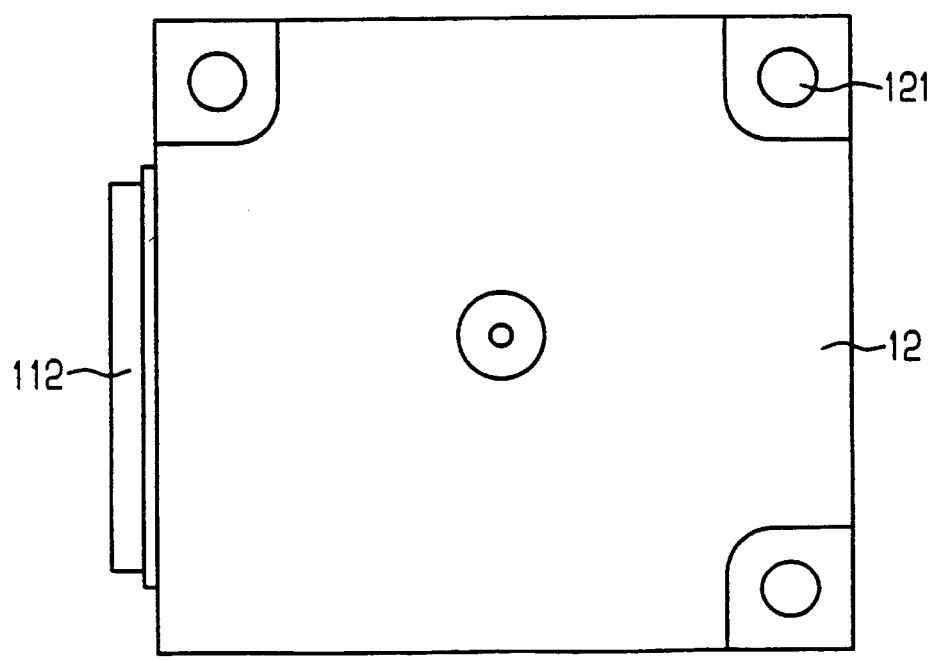
FIG. 2 is a bottom view of the electronic apparatus shown in FIG. 1.

FIG. 2 shows three mounting points 121 at which the air bag control apparatus can be fastened to a car body. The mounting points 121 are located on the periphery of the circuit board. In the vicinity of the mounting points 121, the circuit board contains bores. The plastic housing 12 has recesses corresponding to the bores and contact surfaces surrounding the recesses for fasteners such as screws or rivets, for example.

Figure 3:
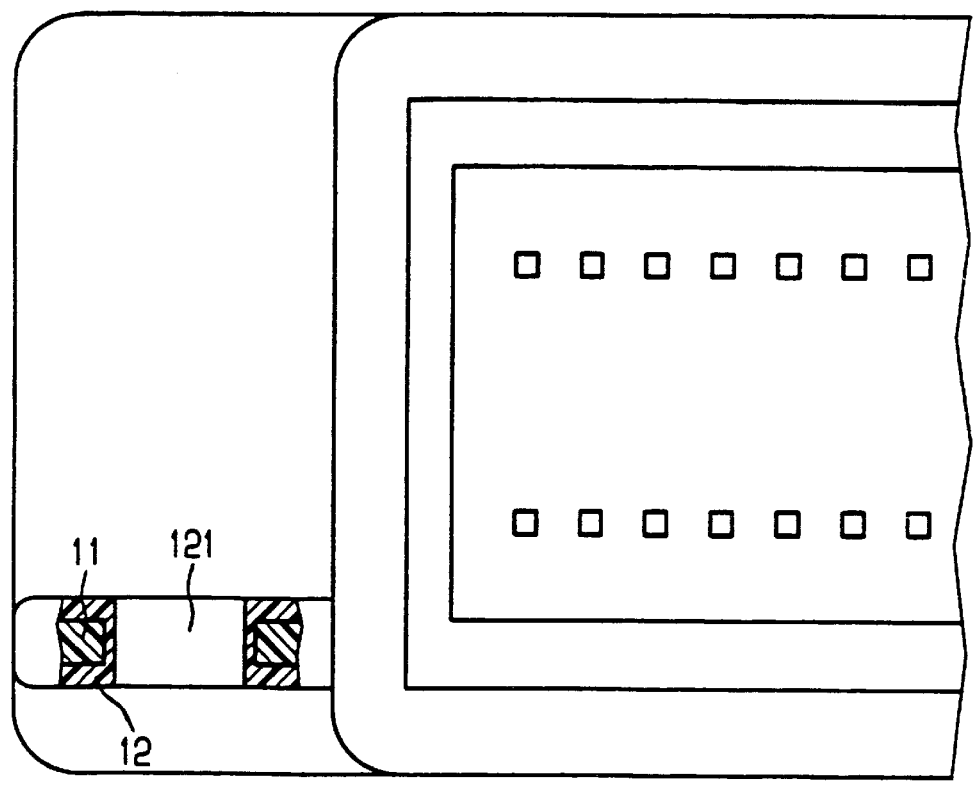
FIG. 3 is a partial view of the electronic apparatus shown in FIG. 1, with a plug connector.

FIG. 3 shows the circuit board 11 embedded into the material of the plastic housing at a fastening point 121. In this manner, after the electronic apparatus 1 is mounted, impulses are transferred directly through the fastening points to the sensor disposed in the electronic apparatus 1. Likewise, natural vibrations of the circuit board 11 in the plastic housing 12 are reliably suppressed. In addition, the sensor can also be embedded into the material of the plastic housing 12.

While the present invention has been disclosed with reference to certain preferred embodiments, numerous modifications, alterations, and changes to the described embodiments are possible without departing from the sphere and scope of the present invention, as defined in the appended claims. Accordingly, it is intended that the present invention not be limited to the described embodiments, but that it have the full scope defined by the language of the following claims, and equivalents thereof.

What is claimed is:

1. A method for transferring impulses from a vehicle body to an electronic sensor, the method comprising:

mounting the electronic sensor on an electronic circuit board;

blow molding a one-piece plastic housing around the electronic circuit board and the sensor such that the electronic circuit board is secured to the plastic housing; and fixing the one-piece plastic housing to the vehicle body.

2. The method according to claim 1, wherein the blow molding includes securing the electronic circuit board by contiguously sandwiching the electronic circuit board at at-least one location.

3. The method according to claim 2, wherein the at-least one location is selected from the group consisting of central locations with respect to the electronic circuit board and peripheral locations with respect to the electronic circuit board, and the fixing includes fastening at-least one of the central and peripheral locations to the vehicle body.

4. The method according to claim 3, wherein the fixing includes fastening a plurality of the at-least one peripheral locations to the vehicle body.

5. The method according to claim 1, wherein the electronic circuit board at least partially defines an interior formation of the plastic housing during the blow molding.

6. The method according to claim 1, wherein the blow molding comprises forming at least one cavity around the electronic circuit board.

7. A method for transferring impulses from a vehicle body to an electronic sensor, the method comprising:

mounting the electronic sensor on an electronic circuit board;

blow molding a one-piece plastic housing around the electronic circuit board and the sensor such that the electronic circuit board is secured to the plastic housing;

fixing the one-piece plastic housing to the vehicle body; and providing an electronic terminal strip fixed to the electronic circuit board;

wherein the blow molding includes blowing fluid through the electronic terminal strip to form the plastic housing.

8. An electronic apparatus, comprising:

a one-piece plastic housing made by blow molding;

an electronic circuit board secured in-situ during blow molding the plastic housing; at-least one location wherein the plastic housing contiguously sandwiches the electronic circuit board; and wherein a first at-least one location includes a mounting hole penetrating the plastic housing and the electronic circuit board.

9. The electronic apparatus according to claim 8, wherein the first at-least one location is peripherally located with respect to the electronic circuit board, and a second at-least one location is centrally located with respect to the electronic circuit board.

10. An electronic apparatus, comprising:

a one-piece plastic housing made by blow molding;

an electronic circuit board secured in-situ during blow molding the plastic housing; at-least one location wherein the plastic housing contiguously sandwiches the electronic circuit board; wherein the electronic circuit board includes a first surface, a second surface generally oppositely facing from the first surface, and an aperture extending between the first and second surfaces at one at-least one location; and the plastic housing includes a first portion contiguously engaging the first surface at the one at-least one location, a second portion contiguously engaging the second surface at the one at-least one location, and an annular portion contiguously engaging the aperture and extending through the electronic circuit board.

11. The electronic apparatus according to claim 10, further comprising an acceleration sensor secured to the electronic circuit board,
   wherein the aperture is formed to connect the housing with a vehicle body so that an impulse imparted to the vehicle body may be transmitted from the vehicle body to the acceleration sensor.

12. An electronic apparatus, comprising:
a one-piece plastic housing made by blow molding;
an electronic circuit board secured in-situ during blow molding the plastic housing; at-least one location wherein the plastic housing contiguously sandwiches the electronic circuit board; and wherein the one-piece plastic housing defines at least one cavity around the electronic circuit board.

* * * * *